United States Patent
Wu et al.

(10) Patent No.: US 10,566,125 B2
(45) Date of Patent: Feb. 18, 2020

(54) MAGNETIC TRANSFER MODULE AND METHOD FOR TRANSFERRING ELECTRONIC ELEMENT

(71) Applicant: Industrial Technology Research Institute, Hsinchu (TW)

(72) Inventors: Ming-Hsien Wu, Tainan (TW); Yen-Hsiang Fang, New Taipei (TW); Chia-Hsin Chao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 152 days.

(21) Appl. No.: 15/822,217

(22) Filed: Nov. 27, 2017

(65) Prior Publication Data
US 2018/0301265 A1     Oct. 18, 2018

(30) Foreign Application Priority Data

Apr. 12, 2017 (TW) .............................. 106112115 A (51) Int. Cl.
*H01F 7/20* (2006.01)
*B25J 15/06* (2006.01)
(Continued)

(52) U.S. Cl.
CPC .......... *H01F 7/206* (2013.01); *B25J 15/0608* (2013.01); *H01F 13/006* (2013.01);
(Continued)

(58) Field of Classification Search
CPC ....................................................... H01F 7/206
(Continued)

(56) References Cited

U.S. PATENT DOCUMENTS 3,409,806 A * 11/1968 Fritz ..................... B66C 1/06
361/210
6,355,491 B1   3/2002 Zhou et al.
(Continued)

FOREIGN PATENT DOCUMENTS

CN        104904001       9/2015
TW        201327721       7/2013
(Continued)

OTHER PUBLICATIONS

Hyung Kwon Kim, et al., "Generation of Local Magnetic Field by Nano Electro-Magnets," Japanese Journal of Applied Physics, vol. 43, No. 4B, 2004, pp. 2054-2056.
(Continued)

*Primary Examiner* — Shawki S Ismail
*Assistant Examiner* — Lisa N Homza
(74) *Attorney, Agent, or Firm* — JCIPRNET (57) ABSTRACT

A magnetic transfer module adapted to transfer a plurality of electronic elements. The magnetic transfer module includes an electromagnet and a plurality of transfer unit. The transfer units are connected to the electromagnet, each of the transfer units includes a ferromagnetic material element, and at least one of the transfer units includes a heating element. The electromagnet magnetizes the ferromagnetic material element, such that the ferromagnetic material element magnetically attracts one of the electronic elements. The heating element is disposed between the electromagnet and the ferromagnetic material element, and heats the ferromagnetic material element to demagnetize the ferromagnetic material element while being actuated.

11 Claims, 9 Drawing Sheets

(51) Int. Cl.
  *H05K 13/04* (2006.01)
  *H01F 13/00* (2006.01)
  *H01L 21/67* (2006.01)
  *H01L 33/00* (2010.01)

(52) U.S. Cl.
  CPC ....... *H05K 13/041* (2018.08); *H05K 13/0408* (2013.01); *H01L 21/67144* (2013.01); *H01L 33/0095* (2013.01)

(58) Field of Classification Search
  USPC .......................................................... 335/289
  See application file for complete search history.

(56) References Cited

U.S. PATENT DOCUMENTS

| | | | |
|---|---|---|---|
| 8,333,860 | B1 | 12/2012 | Bibl et al. |
| 8,415,771 | B1 | 4/2013 | Golda et al. |
| 8,789,573 | B2 | 7/2014 | Bibl et al. |
| 8,933,433 | B2 | 1/2015 | Higginson et al. |
| 8,945,968 | B2 | 2/2015 | Bibl et al. |
| 10,134,709 | B1* | 11/2018 | Wu ................... H01L 25/0655 |
| 2008/0315336 | A1 | 12/2008 | Ravindra et al. |
| 2011/0151588 | A1 | 6/2011 | Ashdown et al. |
| 2011/0299044 | A1* | 12/2011 | Yeh ....................... H04N 9/315 353/52 |
| 2013/0026511 | A1* | 1/2013 | Yeh ................... H01L 25/0753 257/89 |
| 2014/0290867 | A1 | 10/2014 | Bibl et al. |
| 2014/0340900 | A1 | 11/2014 | Bathurst et al. |
| 2016/0172253 | A1* | 6/2016 | Wu ......................... H01L 33/62 438/15 |
| 2017/0032203 | A1* | 2/2017 | Chao .................. G06K 9/00885 |
| 2017/0034922 | A1* | 2/2017 | Wu ...................... H04B 10/079 |
| 2018/0032826 | A1* | 2/2018 | Chao .................... G06K 9/2018 |

FOREIGN PATENT DOCUMENTS

| | | |
|---|---|---|
| TW | 201448101 | 12/2014 |
| TW | 1482547 | 4/2015 |

OTHER PUBLICATIONS

Yushan Zheng, et al., "A BioMEMS chip with integrated micro electromagnet array towards bio-particles manipulation," Microelectronic Engineering, vol. 128, Oct. 2014, pp. 1-6.

Bappaditya Pal, et al., "High temperature ferromagnetism and optical properties of Co doped ZnO nanoparticles," Journal of Applied Physics, vol. 108, Issue 8, 2010, pp. 1-9.

Bok Y. Ahn, et al., "Omnidirectional Printing of Flexible, Stretchable,and Spanning Silver Microelectrodes," Science, vol. 323, Mar. 2009, pp. 1590-1593.

Sang-Il Park, et al., "Printed Assemblies of Inorganic Light-Emitting Diodes for Deformable and Semitransparent Displays," Science, vol. 325, Aug. 2009, pp. 977-981.

"Notice of Allowance of Taiwan Counterpart Application," dated Sep. 20, 2017, p. 1-p. 3, in which the listed references (US patent application No. 3-4 and Foreign patent no. 4) were cited.

* cited by examiner

MAGNETIC TRANSFER MODULE AND METHOD FOR TRANSFERRING ELECTRONIC ELEMENT

CROSS-REFERENCE TO RELATED APPLICATION

This application claims the priority benefit of Taiwan application serial no. 106112115, filed on Apr. 12, 2017. The entirety of the above-mentioned patent application is hereby incorporated by reference herein and made a part of this specification.

TECHNICAL FIELD

The disclosure relates to a transfer module and a transfer method, and more particularly, to a magnetic transfer module and a method for transferring electronic elements.

BACKGROUND

Inorganic light emitting diodes (LEDs) have features of self-luminous, high brightness and so on, and therefore have been widely applied in the fields of illumination, display, projector and so forth. Taking monolithic full color micro-LED displays as an example, monolithic micro-displays have been widely used in projector and faced with a bottleneck of colorizing technology. Generally, in order to obtain different colored lights, epitaxial processes for fabricating a single LED chip including a plurality of light emitting layers capable of emitting different colored lights has already been proposed. In this case, the single LED chip can provide different colored lights. Since lattice constants of the light emitting layers capable of emitting different colored lights are different, growth of the light emitting layers on a same substrate is difficult to be achieved. Accordingly, another solution has been proposed. In order to obtain different colored lights, at least one LED chip capable of emitting light with short wavelength and a plurality of wavelength conversion materials are used, wherein the wavelength conversion materials are capable of being excited by the light emitted from the LED chip and generate excited light having different color. However, the conversion efficiency of the wavelength conversion materials is low and it is difficult to coat the wavelength conversion materials uniformly.

The picking-up and placement technique for LED chips has a better chance to enhance brightness and display quality of a monolithic micro-display significantly. To one ordinary skilled in the art, how to efficiently pick-up and place the LED chips to a circuit substrate of the monolithic micro-display is an important issue.

SUMMARY

The disclosure provides a magnetic transfer module and a method for transferring electronic elements that can rapidly and efficiently perform electronic element transferring.

The magnetic transfer module of the disclosure is adapted to transfer a plurality of electronic elements. The magnetic transfer module includes an electromagnet and a plurality of transfer units. The transfer units are connected to the electromagnet, each of the transfer units includes a ferromagnetic material element, and at least one of the transfer units includes a heating element. The electromagnet magnetizes the ferromagnetic material element such that the ferromagnetic material element magnetically attracts one of the electronic elements. The heating element is disposed between the electromagnet and the ferromagnetic material element, and heats the ferromagnetic material element to demagnetize the ferromagnetic material element while being actuated.

Based on the above, in the magnetic transfer module of the disclosure, the heating element is disposed between the ferromagnetic material element and the electromagnet, and each of the heating elements is adapted to be controlled independently to heat the corresponding ferromagnetic material element and thereby demagnetize the ferromagnetic material element. Therefore, parts of the electronic elements are adapted to be transferred selectively by the ferromagnetic material element having magnetism according to requirements of manufacturing process, so as to improve flexibility of electronic element transferring. Thus, an effect of rapidly and efficiently transferring the electronic elements is obtained.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
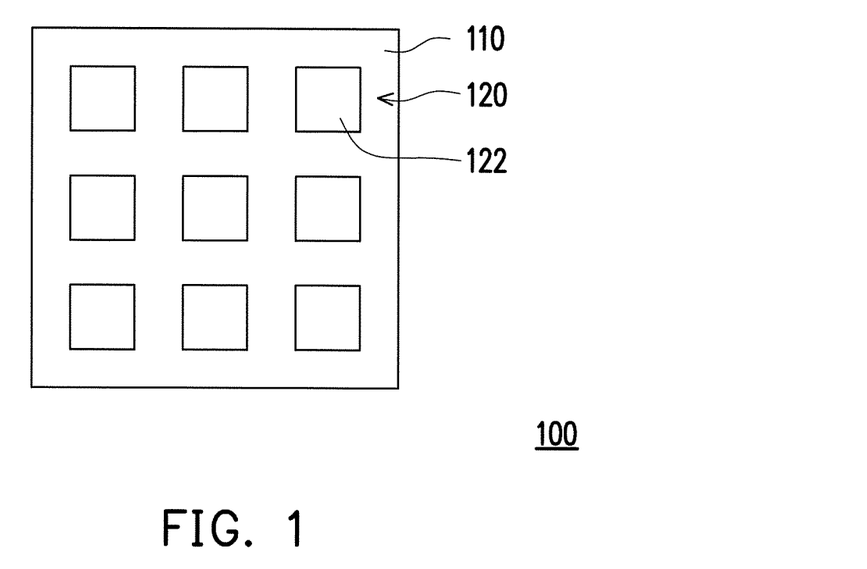
FIG. 1 is a bottom view of a magnetic transfer module of an embodiment of the disclosure.
Figure 2A:
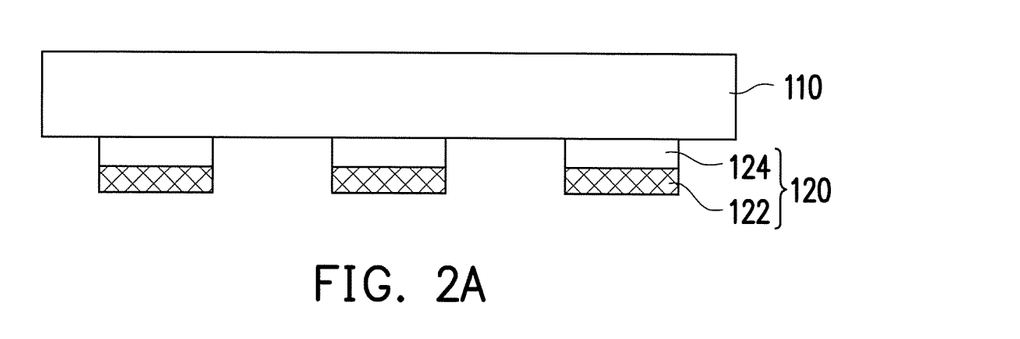
FIG. 2A is a side view of the magnetic transfer module of FIG. 1.

FIG. 1 is a bottom view of a magnetic transfer module of an embodiment of the disclosure. FIG. 2A is a side view of the magnetic transfer module of FIG. 1. Referring to FIG. 1 and FIG. 2A, the magnetic transfer module 100 of the embodiment includes an electromagnet 110 and a plurality of transfer units 120. The transfer units 120 are connected to the electromagnet 110 and arranged in an array on the electromagnet 110. Each of the transfer units 120 includes a ferromagnetic material element 122 and a heating element 124 aligned to each other, and the heating element 124 is disposed between the electromagnet 110 and the ferromagnetic material element 122. In the embodiment, the amount of the transfer units 120 is illustrated as nine in FIG. 1, but the disclosure is not limited thereto. The amount of the transfer unit 120 can be any other suitable amount. In addition, the material of the ferromagnetic material element 122 is, for example, permanent magnetic material, but the disclosure is not limited thereto.

The ferromagnetic material elements 122 comprises, for example, Al—Ni—Co magnet, Sm—Co magnet, ferrite, Nd magnet or other types of permanent magnetic body, and the disclosure is not limited thereto. The electromagnet 110 is adapted to generate magnetic field to magnetize at least one of the ferromagnetic material elements 122, such that at least one of the ferromagnetic material elements 122 is adapted to magnetically attract the electronic element. In some embodiment, each of the ferromagnetic material elements 122 is magnetized through magnetic field generated by the electromagnet 110, such that each of the ferromagnetic material elements 122 is adapted to magnetically attract the electronic element. In addition, each of the heating elements 124 is adapted to be controlled independently to heat the corresponding ferromagnetic material element 122 while being actuated, such that the ferromagnetic material element 122 is demagnetized. Therefore, parts of the electronic elements are adapted to be transferred selectively by the ferromagnetic material element 122 having magnetism according to requirements of manufacturing process, so as to improve flexibility of electronic element transferring. Thus, an effect of rapidly and efficiently transferring the electronic elements is obtained. The electronic elements are, for example, light emitting diode (LED) elements or other types of microelectronic elements. The process that the magnetic transfer module 100 transfers the electronic elements is described specifically below by Figures.

Figure 2B:
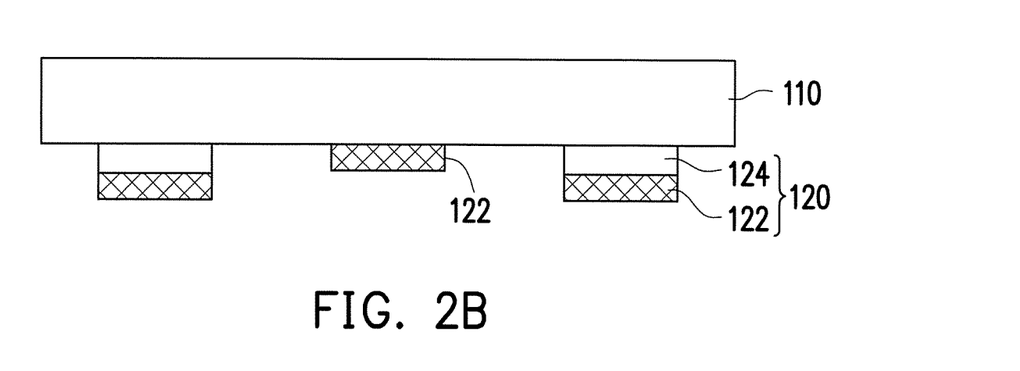
FIG. 2B is a side view of a magnetic transfer module of another embodiment of the disclosure.

FIG. 2B is a side view of a magnetic transfer module of another embodiment of the disclosure. The difference between the embodiments shown in FIG. 2A and FIG. 2B is that, all the ferromagnetic material elements 122 in FIG. 2A are configured with the corresponding heating elements 124, while merely parts of the ferromagnetic material elements 122 in FIG. 2B are configured with the corresponding heating elements 124 (illustrated as the left one and the right one of the ferromagnetic material elements 122 are configured with the corresponding heating elements 124) and other ferromagnetic material elements 122 in FIG. 2B are not configured with corresponding heating elements (illustrated as the middle one of the ferromagnetic material elements 122 is not configured with a corresponding heating element), and the disclosure is not limited thereto. In other words, each of the transfer units 120 does not necessarily include a heating element 124, and each of the transfer units 120 may be selectively arranged with a heating element 124 or not according to practical utilization.

Figure 3:
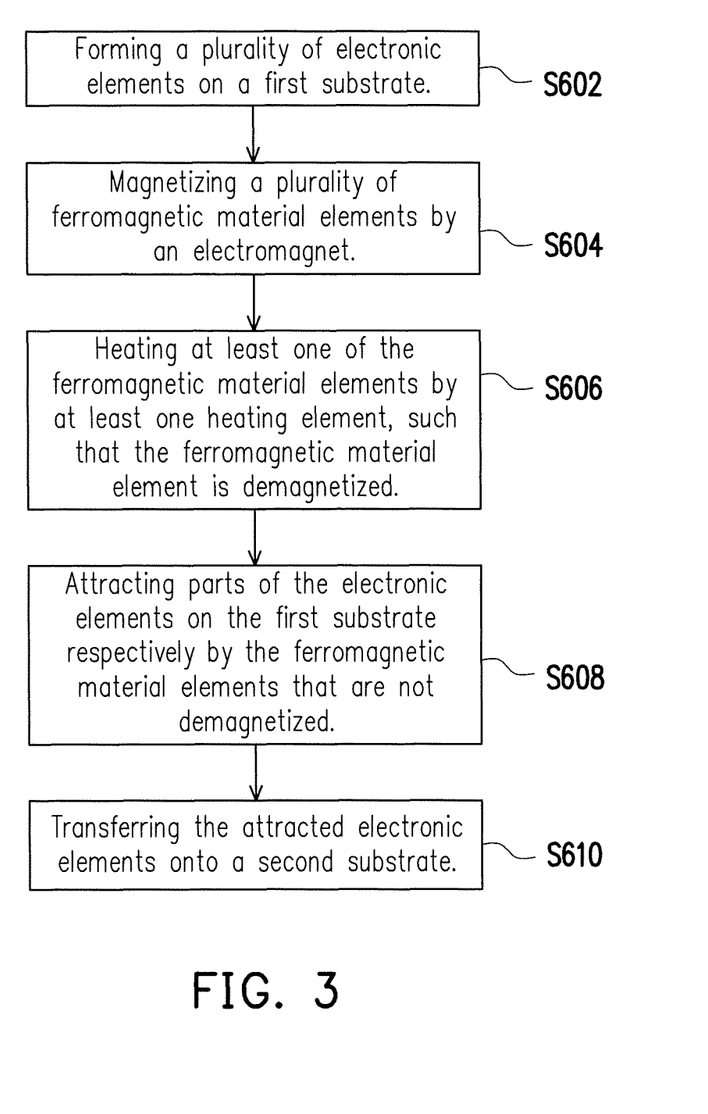
FIG. 3 illustrates a process of a method for transferring electronic elements of an embodiment of the disclosure.
Figure 4A:
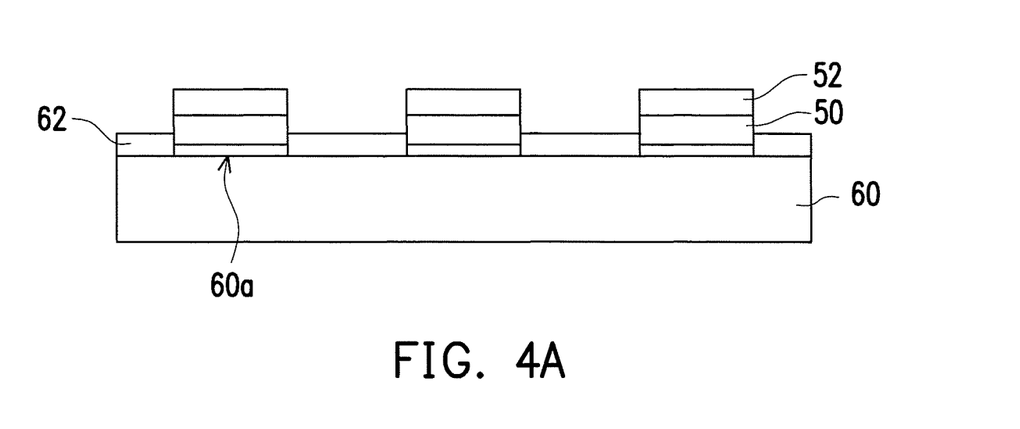
FIG. 4A to FIG. 4I illustrate steps of transferring electronic elements corresponding to FIG. 3.
Figure 4B:
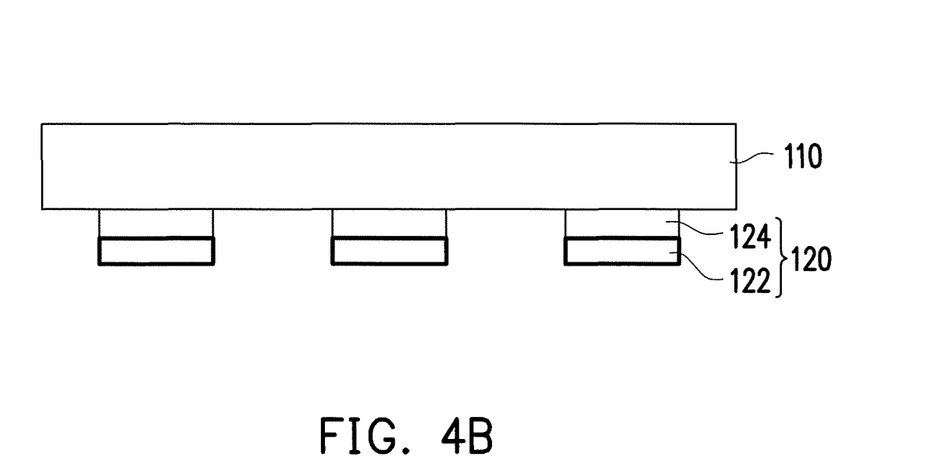
Figure 4C:
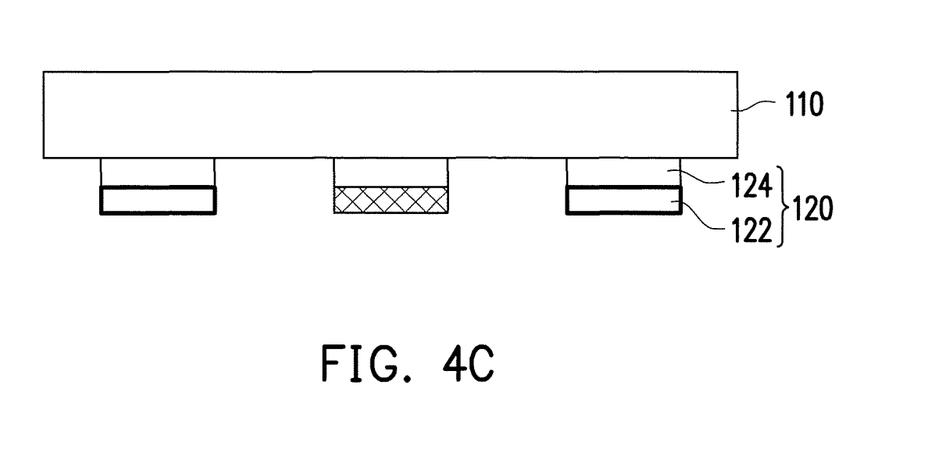
Figure 4D:
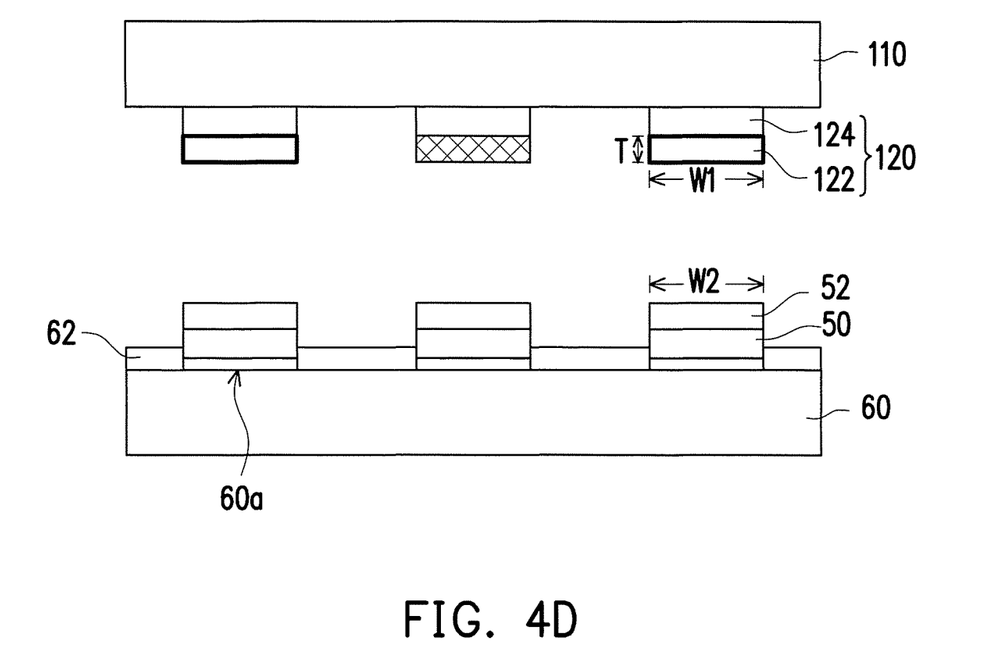
Figure 4E:
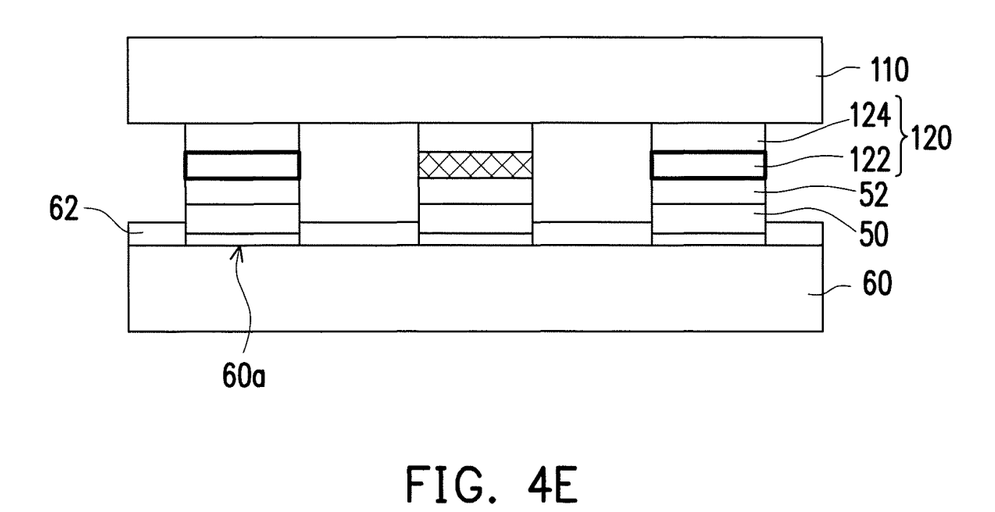
Figure 4F:
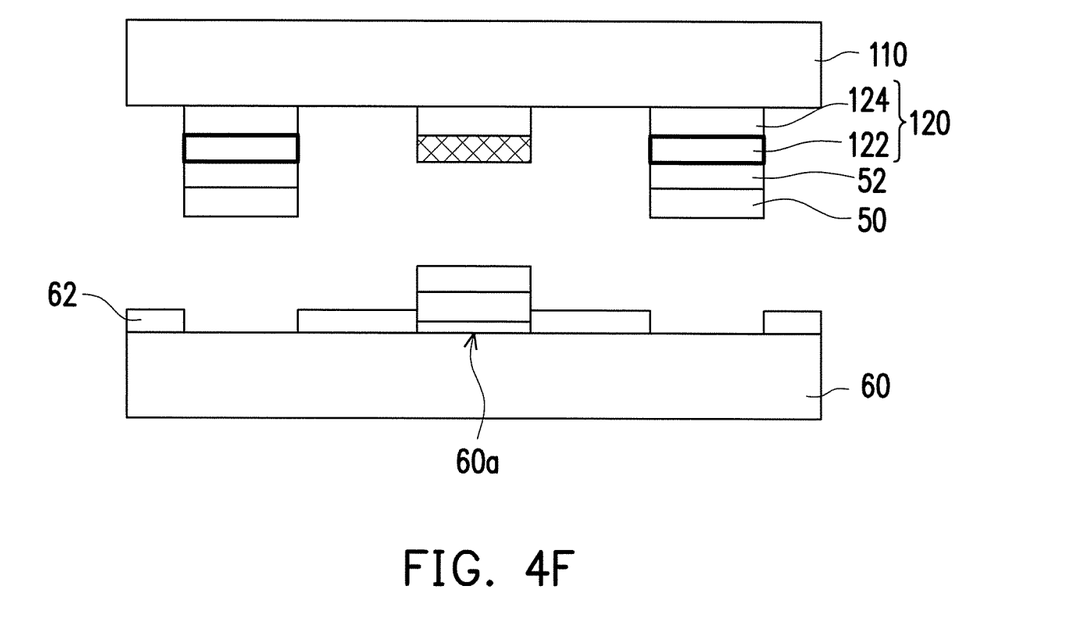
Figure 4G:
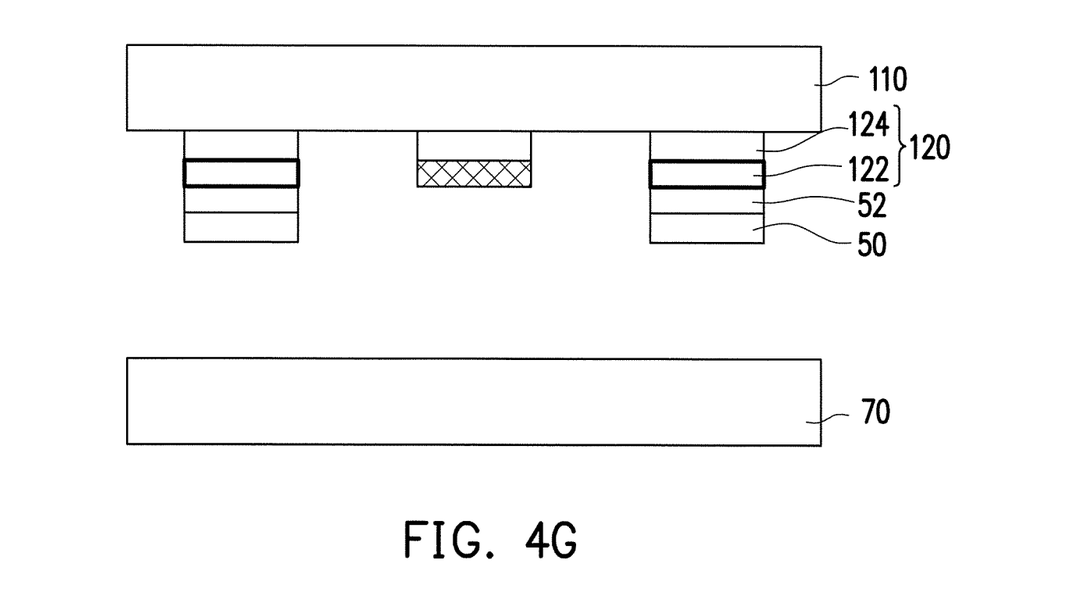
Figure 4H:
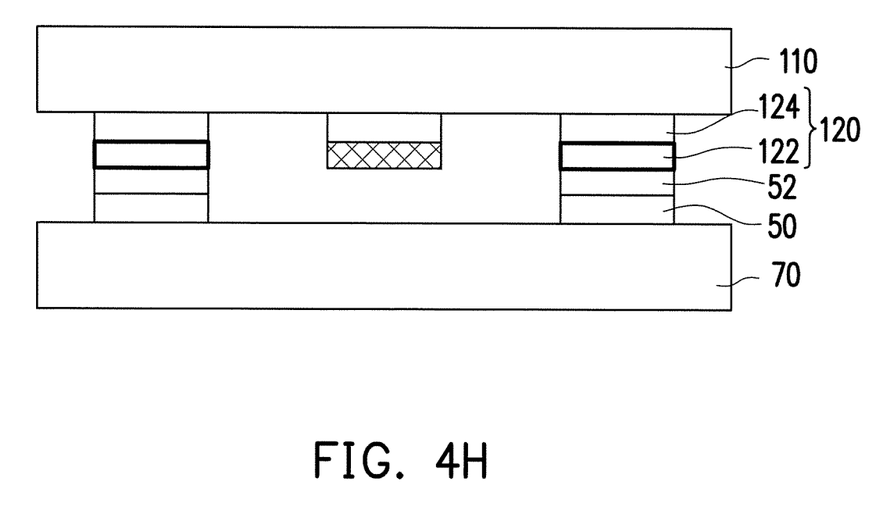
Figure 4I:
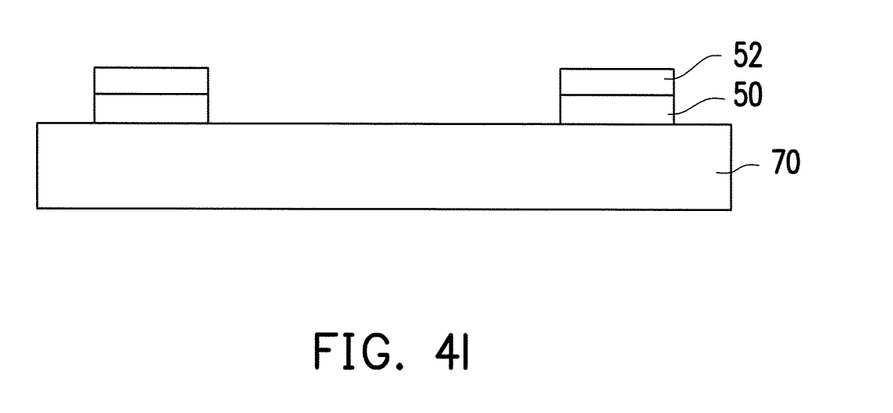

FIG. 3 illustrates a process of a method for transferring electronic elements of an embodiment of the disclosure. FIG. 4A to FIG. 4I illustrate steps of transferring electronic elements corresponding to FIG. 3. Referring to FIG. 3, firstly, a plurality of electronic elements 50 are formed on a first substrate 60 as shown in FIG. 4A (step S602), such that the electronic elements 50 are arranged in an array on the first substrate 60. Then, a plurality of ferromagnetic material elements 122 are magnetized by the electromagnet 110 as shown in FIG. 4B (step S604), wherein the magnetized ferromagnetic material elements 122 are illustrated by thick lines to be distinguished easily. At least one of the ferromagnetic material elements 122 is heated by at least one of the heating elements 124 as shown in FIG. 4C, such that the ferromagnetic material element 122 is demagnetized (step S606), wherein the demagnetized ferromagnetic material element 122 is illustrated by fill lines to be distinguished easily. In this step, each of the heating element 124 is controlled independently, so as to heat the middle one of the ferromagnetic material element 122 by the corresponding heating element 124 to demagnetize the ferromagnetic material element 122. At this time, other heating elements 124 does not heat the corresponding ferromagnetic material elements 122, such that the corresponding ferromagnetic material elements 122 still have magnetism. Parts of the electronic elements 50 on the first substrate 60 are respectively attracted by the ferromagnetic material elements 122 that are not demagnetized as shown in FIG. 4D to FIG. 4F (step S608). Wherein, each of the electronic elements 50, for example, has a ferromagnetic material layer 52 thereon for being adapted to be magnetically attracted by the corresponding ferromagnetic material element 122. The attracted electronic elements 50 are transferred onto a second substrate 70 as shown in FIG. 4G to FIG. 4I (step S610), such that the electronic elements 50 are arranged in an array on the second substrate 70, so as to finish the transferring operation of the electronic elements 50.

In the embodiment, the first substrate 60 has a supporting layer 62 thereon. The supporting layer 62 is configured to support each of the electronic elements 50 so that the electronic elements 50 are away from a surface 60a of the first substrate 60. By doing this, each of the electronic elements 50 attached on the surface 60a is prevented from being hard to be separated from the first substrate 60. As to the detailed configuration and operation of the supporting layer, Taiwan Patent publication No. 201620818 may be consulted and the disclosure is not limited thereto.

Figure 5:
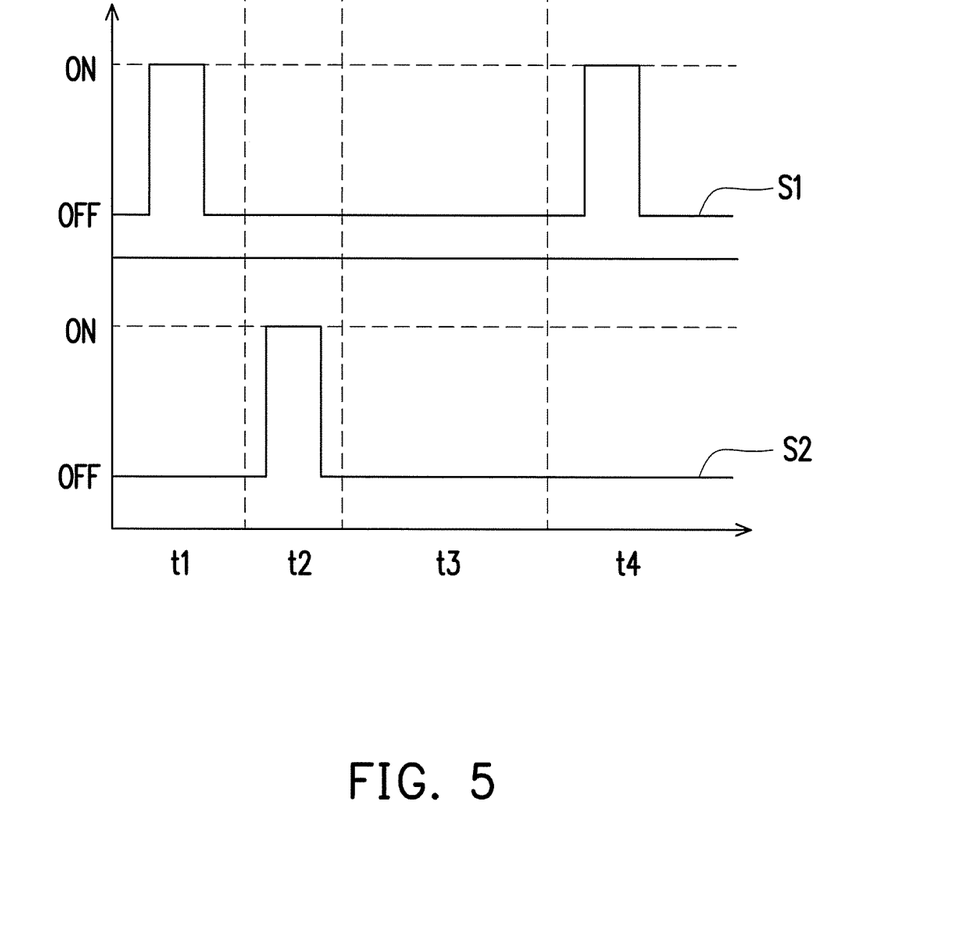
FIG. 5 illustrates operating states of the electromagnet and the heating element of FIG. 4A to FIG. 4I.

FIG. 5 illustrates operating states of the electromagnet and the heating element of FIG. 4A to FIG. 4I, wherein ON means turn on, OFF means turn off, the state S1 is corresponding to the electromagnet 110, and the state S2 is corresponding to the middle one of the heating elements 124. In FIG. 5, the time period t1 is corresponding to the step illustrated in FIG. 4B, the electromagnet 110 is turned on to magnetize at least one of the ferromagnetic material elements 122, and the heating elements 124 are turned off at this time. In some embodiment, the electromagnet 110 is turned on to magnetize each of the ferromagnetic material elements 122. The time period t2 is corresponding to the step illustrated in FIG. 4C, the electromagnet 110 is turned off, and the middle one of the heating element 124 is turned on such that the corresponding ferromagnetic material element 122 is demagnetized. The time period t3 is corresponding to the steps illustrated in FIG. 4D to FIG. 4H, the electromagnet 110 and the heating element 124 are turned off, and transferring of the electronic elements 50 is performed by the ferromagnetic material elements 122 having magnetism. The time period t4 is corresponding to a step after transferring of the electronic elements 50 is finished, the electromagnet 110 is turned on again at this time to magnetize all the ferromagnetic material elements 122, and the operation returns to the step illustrated in FIG. 4B for performing the next transferring operation of the electronic elements.

In the steps illustrated in FIG. 4A to FIG. 4I, the middle one of the electronic element 50 is, for example, a failed element and remains on the first substrate 60, and the other electronic elements 50 are transferred onto the second substrate 70. However, the steps illustrated in FIG. 4A to FIG. 4I are merely examples. In other embodiments, demagnetizing may be selectively performed on different one or different ones of the ferromagnetic material elements 122, for transferring different one or different ones of the electronic elements 50. In addition, the magnetic transfer module 100 may not perform demagnetizing on each of the ferromagnetic material elements 122, such that all the ferromagnetic material elements 122 have magnetism and are adapted to transfer all the electronic elements 50, and the disclosure is not limited thereto.

As described above, the magnetized ferromagnetic material element 122 is adapted to magnetically attract the corresponding electronic element 50 and transfer the electronic element 50 to a substrate (the second substrate 70). Correspondingly, the Curie temperature of the ferromagnetic material element 122 is, for example, larger than the bonding temperature of the electronic element 50 and the substrate, so as to prevent the ferromagnetic material element 122 from being demagnetized unexpectedly due to high temperature of bonding (such as soldering) between the electronic element 50 and the substrate. In the embodiment, the Curie temperature of the ferromagnetic material element 122 is, for example, larger than or equal to 400 degrees centigrade. When the ferromagnetic material element 122 is heated to the Curie temperature, the ferromagnetic material element 122 is demagnetized.

In the embodiment, a distance between adjacent two of the transfer units 120 is equal to a distance between adjacent two of the electronic elements 50, such that each of the transfer units 120 can be accurately aligned to the electronic element 50. However, the disclosure is not limited thereto, and a distance between adjacent two of the transfer units 120 may be other integer multiples of a distance between adjacent two of the electronic elements 50. In addition, a width W1 (labeled in FIG. 4D) of each of the ferromagnetic material elements 122 is larger than or equal to a width W2 (labeled in FIG. 4D) of the electronic element 50 attracted by each of the ferromagnetic material elements 122, such that each of the ferromagnetic material elements 122 can accurately attract the corresponding electronic element 50. Further, a thickness T of each of the ferromagnetic material element 122 is, for example, larger than 5 micrometers.

Figure 6A:
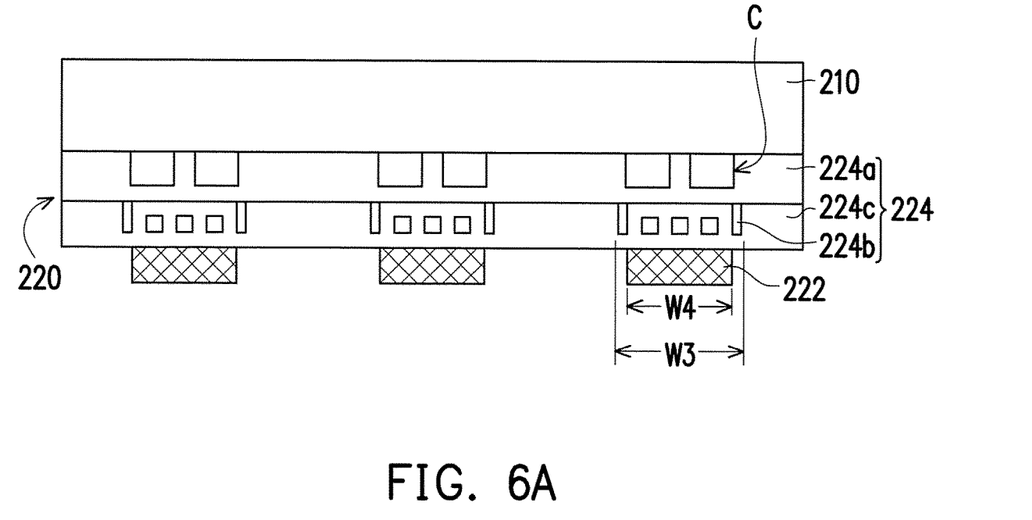
FIG. 6A is a cross-section view of a magnetic transfer module of another embodiment of the disclosure.

Detailed structure of the heating element is described below by another embodiment. FIG. 6A is a cross-section view of a magnetic transfer module of another embodiment of the disclosure. In the embodiment illustrated in FIG. 6A, configuration and operation of an electromagnet 210, transfer units 220, ferromagnetic material elements 222 and heating elements 224 are similar to configuration and operation of the electromagnet 110, the transfer units 120, the ferromagnetic material elements 122 and the heating elements 124 illustrated in FIG. 2A, and are not repeated here. In the embodiment illustrated by FIG. 6A, the heating element 224 includes a base 224a, a metal heating layer 224b and an insulating layer 224c. The insulating layer 224c is disposed on the base 224a and encapsulates the metal heating layer 224b, and the ferromagnetic material element 222 are disposed on the insulating layer 224c. The metal heating layer 224b is adapted to generate heat energy for heating the ferromagnetic material element 222, and the insulating layer 224c prevents the metal heating layer 224b from being exposed which causes unexpected electrical conduction.

Figure 6B:
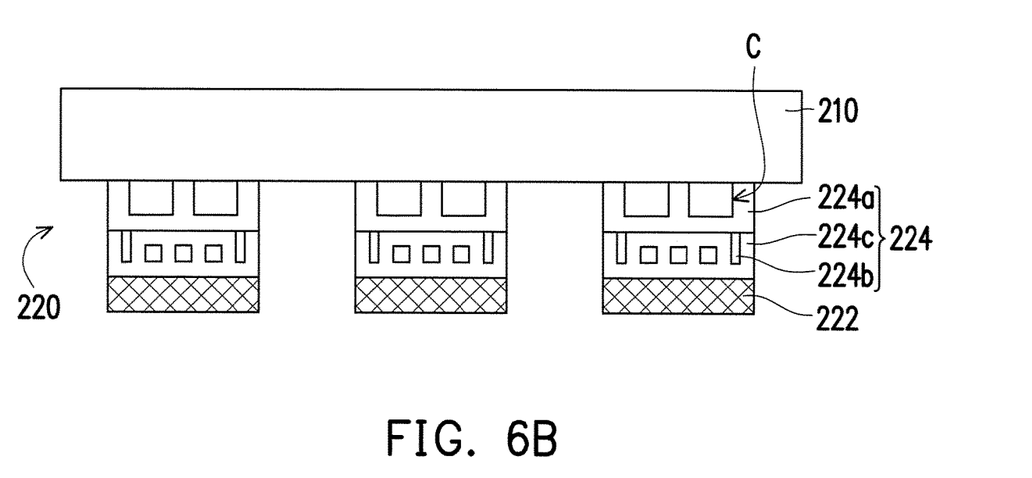
FIG. 6B is a cross-section view of a magnetic transfer module of another embodiment of the disclosure.

FIG. 6B is a cross-section view of a magnetic transfer module of another embodiment of the disclosure. The difference between the embodiments illustrated by FIG. 6A and FIG. 6B is that, the base 224a and the insulating layer 224c of FIG. 6A are continuous structures, while the base 224a and the insulating layer 224c of FIG. 6B are non-continuous structures which are disconnected. The disclosure is not limited thereto.

Figure 7:
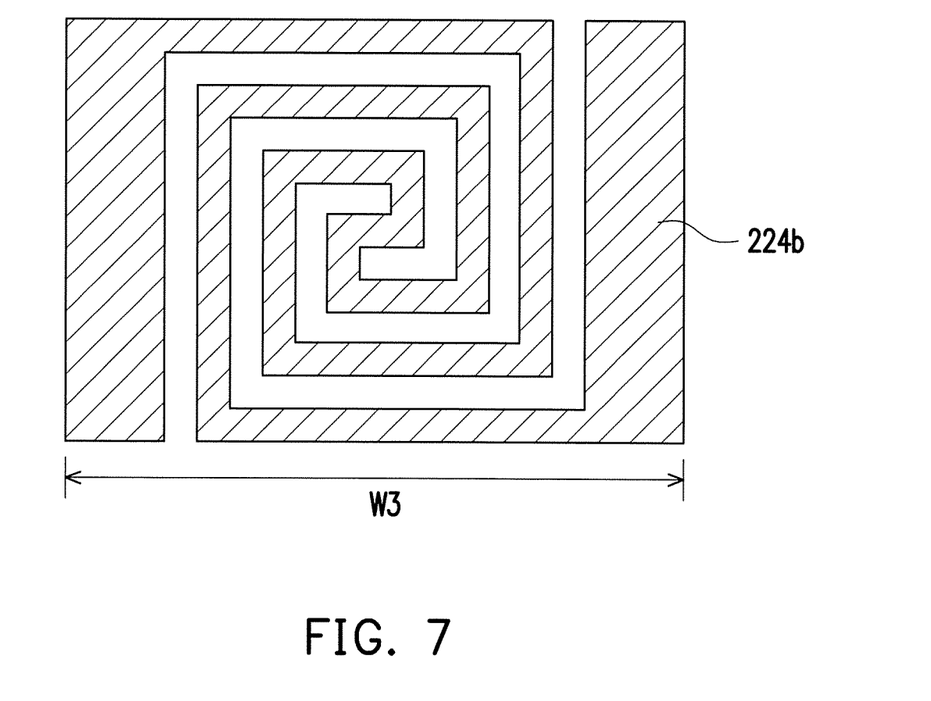
FIG. 7 is a top view of the metal heating layer of FIG. 6A.
Figure 8:
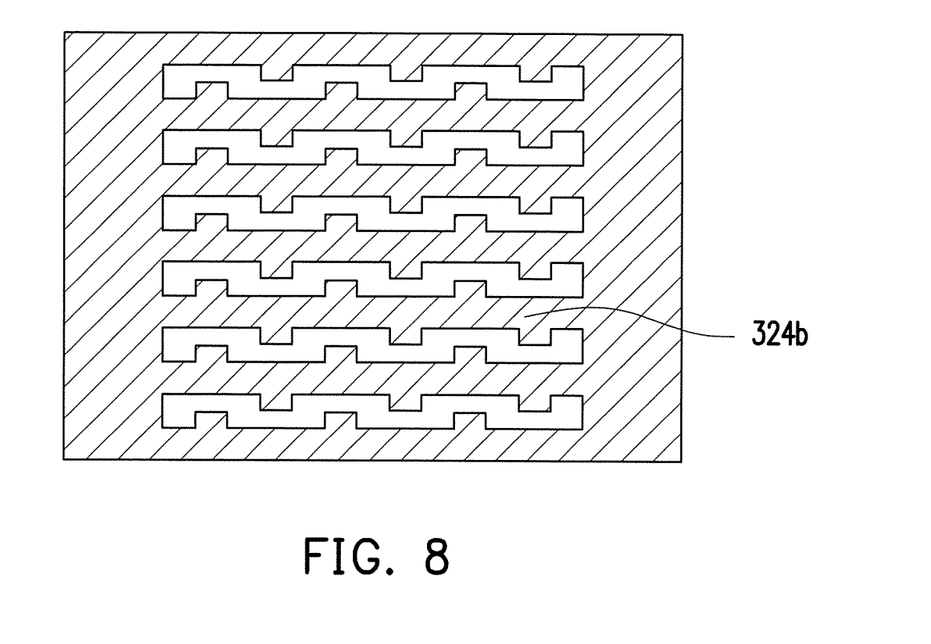
FIG. 8 is a top view of a metal heating layer of another embodiment of the disclosure.

FIG. 7 is a top view of the metal heating layer of FIG. 6A. FIG. 8 is a top view of a metal heating layer of another embodiment of the disclosure. The metal heating layer 224b of the embodiment is, for example, a patterned metal layer illustrated by FIG. 7. However, the metal heating layer may be the patterned metal layer 324b or other forms of metal layers, and the disclosure is not limited thereto. As illustrated in FIG. 6A and FIG. 7, a width W3 of the metal heating layer 224b is larger than or equal to a width W4 of the ferromagnetic material element 222, such that the metal heating layer 224b can accurately heat the ferromagnetic material element 222. A width W4 of the ferromagnetic material element 222 illustrated in FIG. 6A is larger than or equal to the width W2 of the electronic element 50 illustrated in FIG. 4D, such that each of the ferromagnetic material elements 222 can accurately magnetically attract the corresponding electronic element 50. Thus, the width W3 of the metal heating layer 224b illustrated in FIG. 6A and FIG. 7 is larger than or equal to the width W2 of the electronic element 50 illustrated in FIG. 4D. In addition, the base 224a has at least one cavity C for reducing heat conduction efficiency of the base 224a, so as to prevent heat energy generated by the metal heating layer 224b from being consumed unexpectedly through conduction of the base 224a.

Similar to the ferromagnetic material element 122 of the above-mentioned embodiment, the Curie temperature of the ferromagnetic material element 222 of the embodiment is, for example, larger than 400 degrees centigrade. When the metal heating layer 224b heats the ferromagnetic material element 222 to the Curie temperature, the ferromagnetic material element 222 is demagnetized. Correspondingly, a melting point of the metal heating layer 224b is, for example, larger than or equal to 400 degrees centigrade, for preventing the metal heating layer 224b from being failed due to high temperature during heating process.

In summary, in the magnetic transfer module of the disclosure, the heating element is disposed between the ferromagnetic material element and the electromagnet, and each of the heating elements is adapted to be controlled independently to heat the corresponding ferromagnetic material element and thereby demagnetize the ferromagnetic material element. Therefore, parts of the electronic elements are adapted to be transferred selectively by the ferromagnetic material element having magnetism according to requirements of manufacturing process, so as to improve flexibility of electronic element transferring. Thus, an effect of rapidly and efficiently transferring the electronic elements is obtained.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A magnetic transfer module adapted to transfer a plurality of electronic elements, comprising:
   an electromagnet; and
   a plurality of transfer unit, connected to the electromagnet, wherein each of the transfer units comprises a ferromagnetic material element, and the electromagnet magnetizes the ferromagnetic material element such that the ferromagnetic material element magnetically attracts one of the electronic elements,
   wherein at least one of the transfer units comprises a heating element, and the heating element is disposed between the electromagnet and the ferromagnetic material element, and heats the ferromagnetic material element to demagnetize the ferromagnetic material element while being actuated.

2. The magnetic transfer module of claim 1, wherein the transfer units are arranged in an array on the electromagnet.

3. The magnetic transfer module of claim 1, wherein a distance between adjacent two of the transfer units is an integer multiple of a distance between adjacent two of the electronic elements.

4. The magnetic transfer module of claim 1, wherein a width of the ferromagnetic material elements is larger than or equal to a width of the electronic elements magnetically attracted by the ferromagnetic material elements.

5. The magnetic transfer module of claim 1, wherein the heating element comprises a metal heating layer and an insulating layer, the insulating layer encapsulates the metal heating layer, and the ferromagnetic material element is disposed on the insulating layer.

6. The magnetic transfer module of claim 5, wherein a width of the metal heating layer is larger than or equal to a width of the ferromagnetic material element.

7. The magnetic transfer module of claim 5, wherein the heating element comprises a base, the insulating layer is disposed on the base, and the base has at least one cavity.

8. The magnetic transfer module of claim 5, wherein a melting point of the metal heating layer is larger than 400 degrees centigrade.

9. The magnetic transfer module of claim 1, wherein a Curie temperature of the ferromagnetic material element is larger than or equal to 400 degrees centigrade.

10. The magnetic transfer module of claim 1, wherein at least one of the ferromagnetic material elements magnetically attracts at least one of the electronic elements and transfers the at least one of the electronic elements to a substrate, and a Curie temperature of the at least one of the ferromagnetic material elements is larger than a bonding temperature of the at least one of the electronic elements and the substrate.

11. The magnetic transfer module of claim 1, wherein a thickness of the ferromagnetic material element is larger than 5 micrometers.

* * * * *